(12) United States Patent
Makhratchev et al.

(10) Patent No.: US 6,714,033 B1
(45) Date of Patent: Mar. 30, 2004

(54) PROBE FOR DIRECT WAFER POTENTIAL MEASUREMENTS

(75) Inventors: Konstantin Makhratchev, Fremont, CA (US); Mukund Srinivasan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/999,648

(22) Filed: Oct. 31, 2001

Related U.S. Application Data

(60) Provisional application No. 60/304,834, filed on Jul. 11, 2001.

(51) Int. Cl.[7] .................. G01R 31/26; G01R 31/02; G01R 1/04
(52) U.S. Cl. ................ 324/765; 324/754; 324/158.1
(58) Field of Search ........................ 324/765, 754, 324/750, 158.1; 438/17–18; 156/324

(56) References Cited

U.S. PATENT DOCUMENTS

| | | | | |
|---|---|---|---|---|
| 4,602,981 A | * | 7/1986 | Chen et al. ................ 438/17 |
| 4,968,374 A | * | 11/1990 | Tsukada et al. ........ 156/345.47 |
| 5,025,135 A | * | 6/1991 | Gesche et al. ......... 156/345.28 |
| 5,339,039 A | * | 8/1994 | Carlie et al. ................ 324/754 |
| 5,437,895 A | * | 8/1995 | Kodama et al. ............ 438/485 |
| 5,485,451 A | * | 1/1996 | Yamano et al. ............. 250/306 |
| 5,557,215 A | * | 9/1996 | Saeki et al. ................. 324/765 |
| 5,570,031 A | * | 10/1996 | Sasaki et al. ............ 324/158.1 |
| 5,612,850 A | * | 3/1997 | Birang et al. ............... 361/234 |
| 5,698,062 A | * | 12/1997 | Sakamoto et al. .......... 156/345 |
| 5,959,309 A | * | 9/1999 | Tsui et al. ..................... 438/18 |
| 6,095,084 A | * | 8/2000 | Shamouilian et al. ....... 438/656 |
| 6,174,450 B1 | * | 1/2001 | Patrick et al. ............... 156/345 |
| 6,201,208 B1 | * | 3/2001 | Wendt et al. .......... 219/121.41 |
| 6,304,424 B1 | * | 10/2001 | Mett et al. ................... 361/234 |
| 6,326,794 B1 | * | 12/2001 | Lundquist et al. .......... 324/678 |
| 6,433,553 B1 | * | 8/2002 | Goeckner et al. ........... 324/765 |

* cited by examiner

Primary Examiner—Ernest Karlsen
Assistant Examiner—Jermele M. Hollington
(74) Attorney, Agent, or Firm—Thelen Reid & Priest LLP; Thierry K. Lo

(57) ABSTRACT

An apparatus for measuring the DC bias voltage of a wafer in a chamber comprises an electrical coupling, a first filter, a second filter. The electrical coupling receives a probe for measuring the DC bias voltage in the chamber. The probe is disposed within the chamber. A first filter, coupled to the electrical coupling, is disposed within the chamber. A second filter, coupled to the first filter, is disposed outside the chamber.

15 Claims, 4 Drawing Sheets

PROBE FOR DIRECT WAFER POTENTIAL MEASUREMENTS

CROSS-REFERENCE TO RELATED APPLICATIONS

This application claims the benefit of U.S. Provisional Patent Application Serial No. 60/304,834, filed on Jul. 11, 2001, commonly assigned herewith.

FIELD OF THE INVENTION

The present invention relates to plasma etching chambers. More particularly, the present invention relates to an apparatus for measuring the dc bias voltage of a wafer during plasma processing.

BACKGROUND OF THE INVENTION

Integrated circuits are typically fabricated on a wafer of semiconductor material such as silicon or gallium arsenide. During the fabrication process, the wafer is subjected to an ordered series of steps, which may include photomasking, material deposition, oxidation, nitridization, ion implantation, diffusion and etching, in order to achieve a final product.

There are two basic types of etches: ion-assisted etches (also called reactive-ion, plasma or dry etches) and solution etches (also called wet etches). Solution etches are invariably isotropic (omnidirectional) in nature, with the etch rate for a single material being relatively constant in all directions. Reactive-ion etches, on the other hand, are largely anisotropic (unidirectional) in nature. Reactive-ion etches are commonly used to create spacers on substantially vertical sidewalls of other layers, to transfer a mask pattern to an underlying layer with little or no undercutting beneath mask segment edges, and to create contact via insulative layers.

A plasma etch system (often referred to as a reactor) is primarily a vacuum chamber in which a glow discharge is utilized to produce a plasma consisting of chemically reactive species (atoms, radicals, and ions) from a relatively inert molecular gas. The gas is selected so as to generate species which react either kinetically or chemically with the material to be etched. Because dielectric layers cannot be etched using a direct-current-induced glow discharge due to charge accumulation on the surface of the dielectric which quickly neutralizes the dc-voltage potential, most reactors are designed as radio-frequency diode systems and typically operate at a frequency of 13.56 MHz, a frequency reserved for industrial, scientific and medical, non-communication use by international agreement. However, plasma etch processes operating between 100 KHz–80 MHz have been used successfully.

FIG. 1 illustrates a conventional method for measuring the dc bias voltage of a wafer in a capacitively coupled plasma etching chamber. A wafer 102 is disposed on an electrostatic chuck 106 inside a vacuum chamber 104. The electrostatic chuck 106 is electrically coupled to an RF generator 110. A grounded upper electrode 108 is disposed inside the vacuum chamber 104 above the wafer 102. During processing, plasma 112 is generated between the upper electrode 108 and the wafer 102. The plasma 112 generates a dc bias voltage above the surface of the wafer 102. The dc bias voltage is conventionally measured outside the vacuum chamber 104 with a measuring device 114, such as a voltage meter, coupled to the electrostatic chuck 106.

The problem with the above approach is that the Radio Frequency (RF) energy is transferred outside the vacuum chamber 104. So the plasma 112 inside the vacuum chamber 104 is disturbed resulting in less accurate measurements of the dc bias voltage. Another disadvantage is that such a system measures the dc bias voltage on the electrostatic chuck 106, and not the wafer 102 itself. There could be a substantial potential difference between the wafer 102 and the electrostatic chuck 106 due to a number of factors including wafer material or coating, process chemistry, RF power level.

A definite need exists for an apparatus for measuring the dc bias voltage in a vacuum chamber. Specifically, a need exists for an apparatus for measuring the dc bias voltage in a capacitively coupled plasma etching chamber. A primary purpose of the present invention is to solve these needs and provide further, related advantages.

BRIEF DESCRIPTION OF THE INVENTION

An apparatus for measuring the DC bias voltage of a wafer in a chamber comprises an electrical coupling, a fist filter, a second filter. The electrical coupling receives a probe for measuring the DC bias voltage in the chamber. The probe is disposed within the chamber. A first filter, coupled to the electrical coupling, is disposed within the chamber. A second filter, coupled to the first filter, is disposed outside the chamber.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a probe for direct wafer potential measurements. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
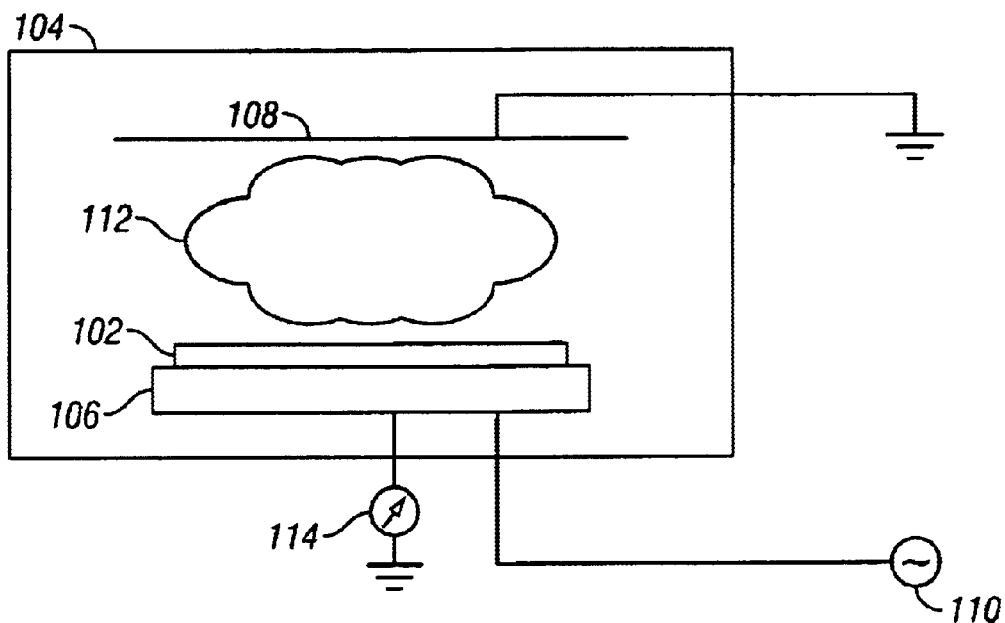
FIG. 1 is a schematic diagram of an apparatus for measuring the dc bias of a wafer in a chamber according to a prior art.
Figure 2:
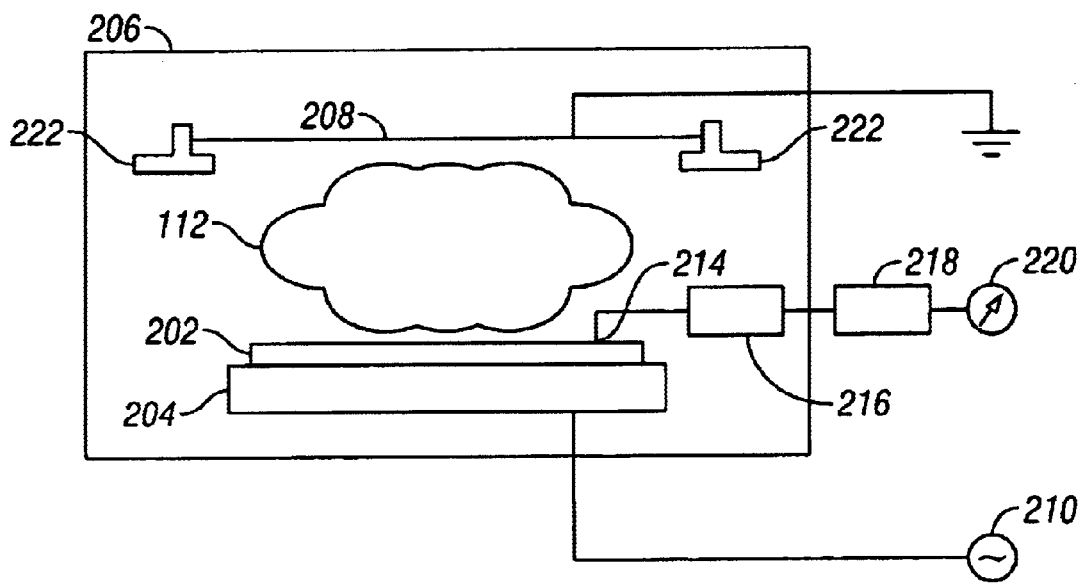
FIG. 2 is a schematic diagram of an apparatus for measuring the dc bias of a wafer in a chamber according to a specific embodiment of the present invention.

FIG. 2 illustrates an apparatus for measuring the dc bias potential of a wafer in a chamber according to a specific embodiment of the present invention. A wafer 202 is disposed on an electrostatic chuck 204 inside a vacuum chamber 206, for example a capacitively coupled plasma etching chamber, having a grounded upper electrode 208. The electrostatic chuck 204 is coupled to a Radio Frequency (RF) source 210. The RF source 210 may comprise, for example, a dual frequency source of 2 Mhz and 27 Mhz. Plasma 212 is generated within the vacuum chamber 206 between the upper electrode 208 and the wafer 202. Since the DC bias is located above the surface of the wafer 202 and beneath plasma 212, an accurate way of measuring the DC bias voltage is to electrically contact a probe 214 on the surface of the wafer 202. The probe 214 is electrically coupled to two electrical filters 216 and 218. The first Radio Frequency (RF) filter 216 is disposed inside the vacuum chamber 206. The second Radio Frequency (RF) filter 218 is disposed outside the vacuum chamber 206. The output of the second filter 218 is coupled to a measuring device 220, such as a voltage meter.

To measure the DC bias voltage on the wafer during plasma processing, the unwanted RF component must be filtered out. A probe with a low-pass filter is usually used for this measurement. To reduce the risk of disturbance on plasma 212, and to reduce the risk of RF exposure from RF source 210, the first filter 216 is placed inside the vacuum chamber 206. The first filter 216 preferably has high input impedance and is able to withstand up to 2k V RF voltage. The first filter 216 preferably also has a high 2 MHz and 27 MHz attenuation. In addition, it is preferable that the first filter 216 has a height of less than 0.01" to fit under the electrode 208 and a confinement ring 222 that usually surrounds the electrode 208 to confine the position of the plasma 212. To satisfy the above requirements, a two-stage filter is described below in detail.

Figure 3:
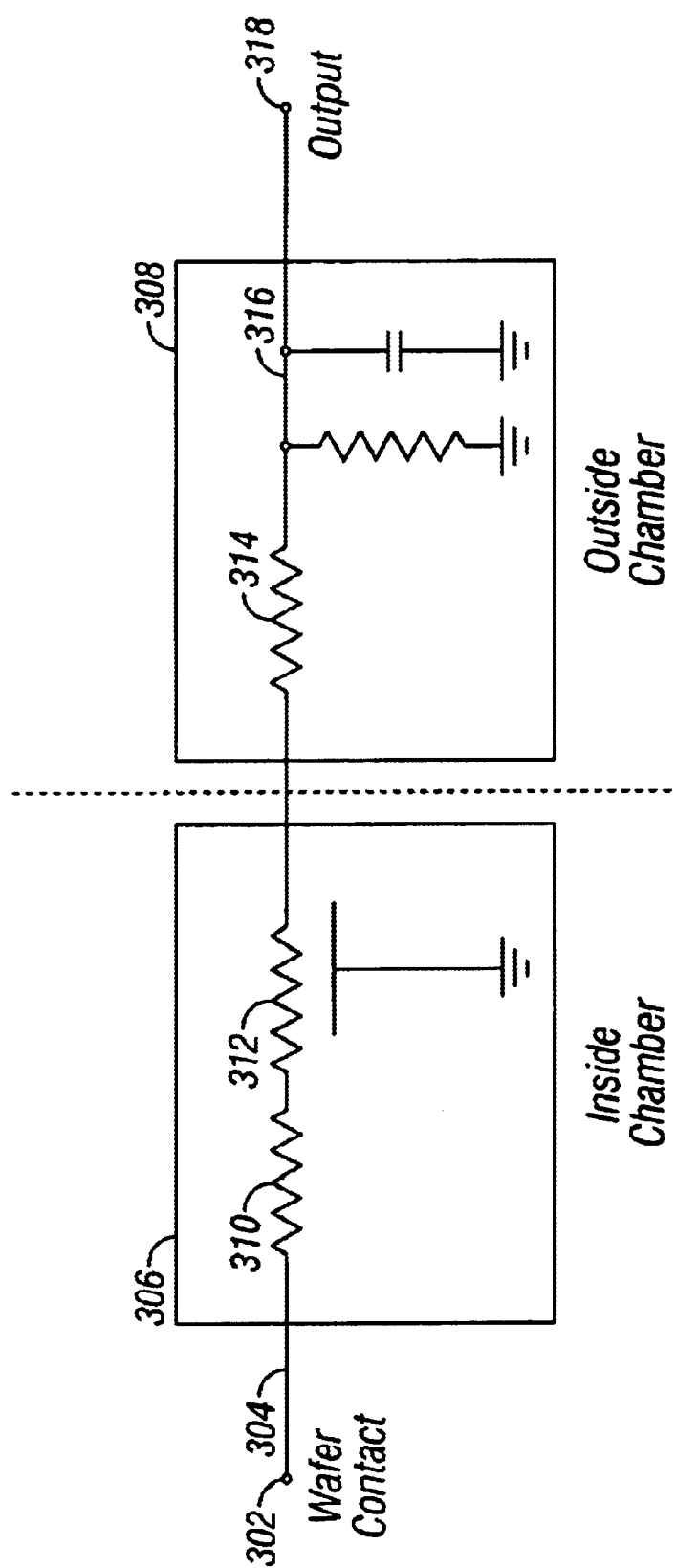
FIG. 3 is a schematic diagram of an electrical circuit of an apparatus for measuring the dc bias of a wafer in a chamber according to a specific embodiment of the present invention.
Figure 4:
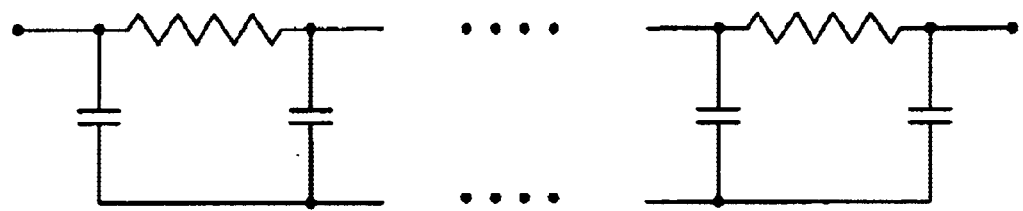
FIG. 4 is a schematic diagram of an electrical circuit of a low-pass filter in a first filter of an apparatus for measuring the dc bias of a wafer in a chamber according to a specific embodiment of the present invention.

FIG. 3 is a schematic diagram of an electrical circuit of an apparatus for measuring the dc bias of a wafer in a chamber according to a specific embodiment of the present invention. A probe 302 electrically contacts the surface of the wafer 202 of FIG. 2. An electrical conductor 304, for example a nickel wire, couples the probe 302 with a first filter 306 disposed within the vacuum chamber 206 of FIG. 2. The first filter 306 is also coupled to a second filter 308 that is outside the vacuum chamber 206. The first filter 306 comprises a resistor 310 coupled to a low-pass filter 312. Preferably, the resistor 310 may have a resistance of 500 K Ohms. Preferably, the low-pass filter 312 may have a resistance of 200 K Ohms and a capacitance of 100 p Farad. FIG. 4 illustrates a schematic of electrical circuit approximating low-pass filter 312 having a combined resistance of 200 K Ohms and a combined capacitance of 100 p Farad. The distributed capacitors and resistors over several legs approximate low-pass filter 312 with a particular resistance and a particular capacitance. However, a higher combination of legs in the electrical circuit of FIG. 4 yields a better approximation of the low-pass filter 312. The resistance of each resistor over the legs of the electrical circuit of FIG. 4 may be approximately the same and should all total the resistance of the low-pass filter 312. The capacitance of each capacitor over the legs of the electrical circuit of FIG. 4 may be approximately the same and should all total the capacitance of the low-pass filter 312.

The second filter 308 comprises a resistor 314 coupled to a low-pass filter 316. Preferably, the resistor 314 may have a resistance of 2 M Ohms. Preferably, the low-pass filter 316 may have a resistance of 100 K Ohms and 20 n Farad. The second filter 308 is coupled to an output 318. Preferably, the second filter 308 may have a cut-off frequency of about 4 kHz.

Figure 5:
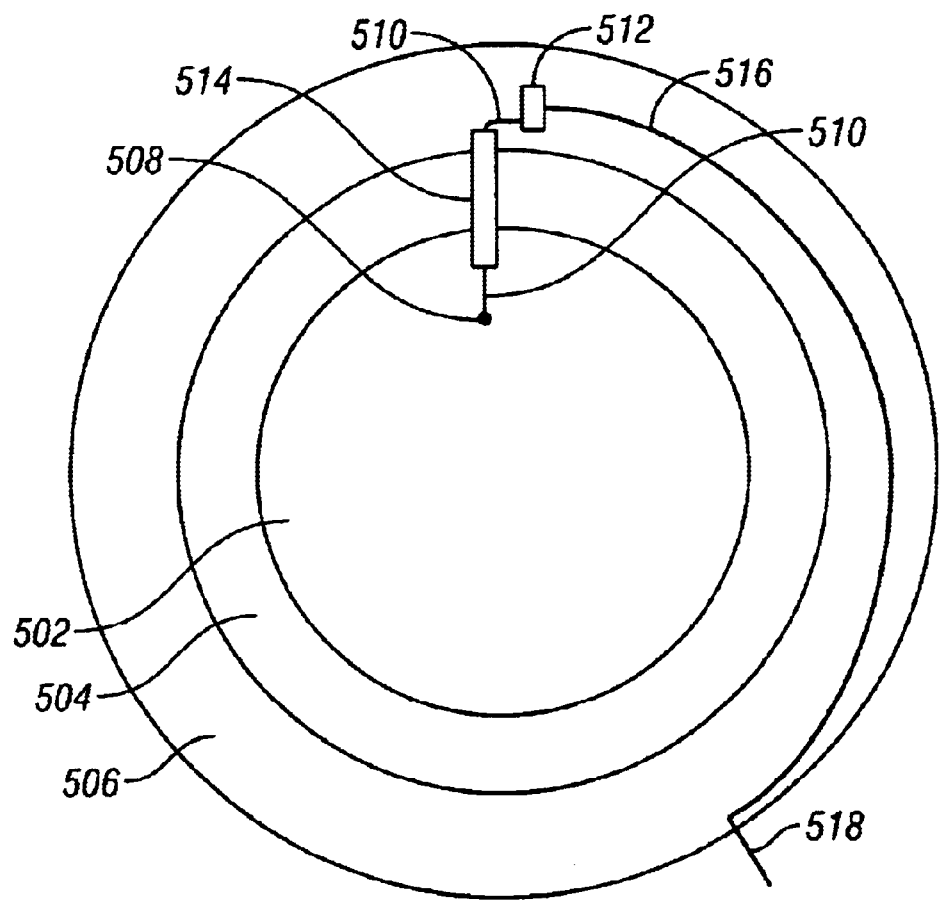
FIG. 5 is a top view schematic diagram of an apparatus for measuring the dc bias of a wafer in a chamber according to a specific embodiment of the present invention.

FIG. 5 is a top view schematic diagram of a first filter of an apparatus for measuring the dc bias of a wafer in a chamber according to a specific embodiment of the present invention. A wafer 502 is disposed on an electrostatic chuck (not shown). The wafer 502 is surrounded with a silicon edge ring 504. Both wafer 502 and silicon edge ring 504 are surrounded with a quartz ring 506. A probe 508 comprises, for example, an electrical contact on the surface of the wafer 502. Preferably, the electrical contact may be an indium contact. However, any other electrical conductor material may be disposed on the surface of the wafer 502, preferably, close to the edge of the wafer 502. An electrical wire 510, for example, a nickel wire, may be coupled to probe 508 and to a resistor 512, for example, a surface mount resistor, disposed on the quartz ring 506. Other types of resistors may be used. The resistor 512 may have, for example, a resistance of 500 M Ohms. A portion of the electrical wire 510 traveling over the silicon edge ring 504 is electrically isolated with a tube 514 having a high dielectric strength, for example, a ceramic tube.

The resistor 512 is electrically coupled to a graphite trace 516. For example, an HB pencil may be used to trace the graphite trace 516. Preferably, the graphite trace 516 may have a length of 10 inches arching over the surface the quartz ring 506. The graphite trace 516 may have, for example, a resistance of approximately 200 K Ohms. The graphite trace 516 may have any other lengths. The end of the graphite trace 516 may be coupled to an electrical wire 518 that is subsequently coupled to the second filter 308 of FIG. 3.

Therefore, the first filter 306 of FIG. 3 may comprise, in a capacitively coupled plasma chamber, the probe 508, the electrical wire 510, the tube 514, the resistor 512, the graphite trace 516, and the electrical wire 518. The estimated cut-off frequency for the first filter 306 may be approximately 2.5 kHz.

Figure 6:
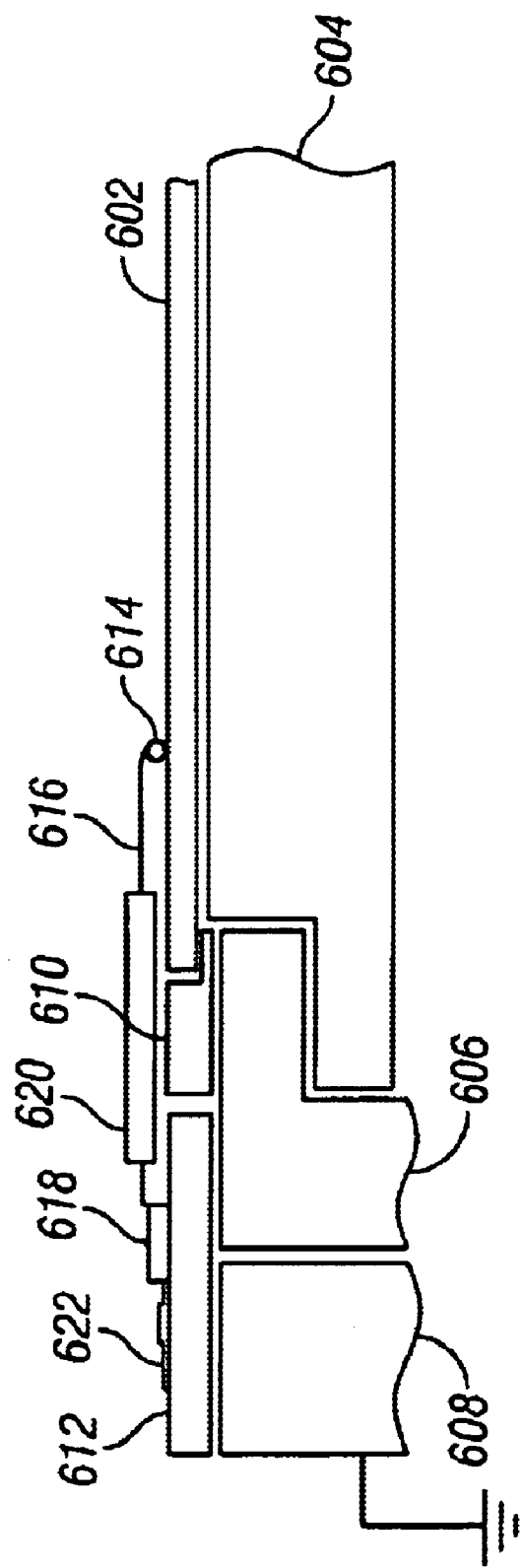
FIG. 6 is a cross-sectional side view of an apparatus for measuring the dc bias of a wafer in a chamber according to a specific embodiment of the present invention.

FIG. 6 is a cross-sectional side view of a first filter of an apparatus for measuring the dc bias of a wafer in a chamber according to a specific embodiment of the present invention. A wafer 602 is disposed on an electrostatic chuck 604. An isolation ring 606 surrounds the electrostatic chuck 604. An outer focus ring 608 surrounds both the isolation ring 606 and the electrostatic chuck 604. The outer focus ring 608 is grounded. A silicon edge ring 610 surrounds the wafer 602 and is supported by the isolation ring 606. A quartz ring 612 surrounds the silicon edge ring 610. Both the quartz ring 612 and the silicon edge ring 610 are supported by the isolation ring 606 and the outer focus ring 608.

A probe 614 as described previously, for example, an indium contact, electrically contacts the wafer 602. An electrical wire 616, such as a nickel wire, couples the probe 614 to a resistor 618. The electrical wire 616 is electrically isolated with a high dielectric strength material, such as a ceramic tube 620. Preferably, the ceramic tube may prevent the electrical wire 616 to come into contact over the silicon edge ring 610. The resistor 618 as described previously may be mounted on the quartz ring 612. A graphite trace 622, electrically coupled to the resistor 618, is disposed on the surface of the quartz ring 612. Since the outer focus ring 608 is grounded, the graphite trace 622 is capacitively coupled to the outer focus ring 608. Therefore, the graphite trace 622 acts as a capacitor connected to ground. The graphite trace 622 may also have a resistance of approximately 200 K Ohms. Since the graphite trace 622 is utilized as a capacitor plate and the quartz ring 612 is used as a dielectric, the circuit is extremely thin and high-voltage stable. The outer focus ring 608 acts as a "grounded" capacitor plate.

The low-pass filter 312 component of FIG. 3 of the first filter 306 of FIG. 3 disposed inside the vacuum chamber may be implemented with the resistor 618 and the graphite trace 612. The characteristics of the quartz ring 612 determine the capacitance of the low-pass filter 312 of FIG. 3. The resistance of the graphite trace determines the resistance of the low-pass filter 312 of FIG. 3.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An apparatus for measuring a Direct Current DC bias voltage of a wafer in a chamber, the apparatus comprising:
   a probe for measuring the DC bias voltage of the wafer, said probe electrically coupled to a top surface of the wafer inside the chamber;
   a first Radio Frequency (RF) filter disposed inside the chamber, said first filter coupled to said probe;
   a second Radio Frequency (RF) filter disposed outside the chamber, said second filter coupled to said first filter; and
   a voltage measuring device coupled to said second filter,
   wherein said first filter filters an RF energy from the chamber before said RF energy is transferred outside the chamber.

2. The apparatus according to claim 1 wherein said probe further comprises an indium contact on the wafer.

3. The apparatus according to claim 1 wherein said first filter further comprises a first low-pass filter.

4. The apparatus according to claim 1 wherein said first filter is coupled to said probe with a nickel wire.

5. The apparatus according to claim 4 wherein said nickel wire is at least partially electrically isolated within a dielectric material.

6. The apparatus according to claim 1 wherein said second filter further comprises a second low-pass filter.

7. An apparatus for measuring a Direct Current DC bias voltage of a wafer in a chamber, the apparatus comprising:
   a probe for measuring the DC bias voltage of the wafer, said probe electrically coupled to a top surface of the wafer inside the chamber;
   a first Radio Frequency (RF) filter disposed within the chamber, said first filter coupled to said probe;
   a second Radio Frequency (RF) filter disposed outside the chamber, said second filter coupled to said first filter; and
   a voltage measuring device coupled to said second filter
   wherein said first filter is coupled to said probe with a nickel wire, said nickel wire is at least partially electrically isolated within a dielectric material, said dielectric material further comprises an alumina tube.

8. A method for measuring the DC bias voltage on a wafer in a chamber, the method comprising:
   coupling a probe to a top surface of the wafer inside the chamber;
   filtering a voltage received by the probe with a first RF filter disposed within the chamber; and
   filtering the voltage received by the probe with a second RF filter disposed outside the chamber,
   wherein said first filter filters an RF enemy from the chamber before said RF energy is transferred outside the chamber.

9. The method according to claim 8 wherein said coupling comprises providing an indium contact on the top surface of the wafer.

10. The method according to claim 9 wherein said coupling comprises coupling said indium contact with a nickel wire.

11. The method according to claim 10 wherein said nickel wire is at least partially electrically isolated within a dielectric material.

12. The method according to claim 8 wherein said first filter further comprises a first low-pass filter.

13. The method according to claim 8 wherein said second filter further comprises a second low-pass filter.

14. A method for measuring the DC bias voltage on a wafer in a chamber, the method comprising:
   coupling a probe to a top surface of the wafer within the chamber;
   filtering a voltage received by the probe with a first RF filter disposed within the chamber; and
   filtering the voltage received by the probe with a second RF filter disposed outside the chamber,
   wherein said coupling comprises providing an indium contact on the top surface of the wafer, coupling said indium contact with a nickel wire, said nickel wire is at least partially electrically isolated within a dielectric material, said dielectric material further comprises an alumina tube.

15. An apparatus for measuring the DC bias voltage on a wafer in a chamber, the apparatus comprising:
   means for probing a top surface of the wafer inside the chamber,
   means for filtering a voltage received by the probe with a first RF filter disposed within the chamber, and
   means for filtering the voltage received by the probe with a second RF filter disposed outside the chamber,
   wherein said first filter filters an RF energy from the chamber before said RF energy is transferred outside the chamber.

* * * * *

UNITED STATES PATENT AND TRADEMARK OFFICE
CERTIFICATE OF CORRECTION

PATENT NO. : 6,714,033 B1
DATED : March 30, 2004
INVENTOR(S) : Konstantin Makhratchev and Mukund Srinivasan It is certified that error appears in the above-identified patent and that said Letters Patent is hereby corrected as shown below:

Column 2,
Line 20, replace "fist" with -- first --.

Column 6,
Line 19, replace "enemy" with -- energy --.

Signed and Sealed this

Fourteenth Day of December, 2004

JON W. DUDAS
*Director of the United States Patent and Trademark Office*